(12) United States Patent
Lee et al.

(10) Patent No.: US 6,235,354 B1
(45) Date of Patent: May 22, 2001

(54) METHOD OF FORMING A LEVEL SILICON OXIDE LAYER ON TWO REGIONS OF DIFFERENT HEIGHTS ON A SEMICONDUCTOR WAFER

(75) Inventors: Chin-Hui Lee, Taipei; Ting-Chi Lin, Miao-Li Hsien; Chih-Cheng Liu, Pan-Chiao, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/431,940

(22) Filed: Nov. 1, 1999

(51) Int. Cl.$^7$ .................................................. H01L 21/306

(52) U.S. Cl. ........................ 427/534; 427/532; 438/619; 438/620; 438/758; 438/761; 438/762; 438/786; 438/787; 438/791; 257/758

(58) Field of Search .................................. 438/758, 761, 438/762, 786, 787, 791, 619, 620; 257/758; 427/532, 534

(56) References Cited

U.S. PATENT DOCUMENTS 5,849,643 * 12/1998 Gilmer et al. ........................ 438/77

* cited by examiner

Primary Examiner—Charles Bowers
Assistant Examiner—Lisa Kilday
(74) Attorney, Agent, or Firm—Winston Hsu

(57) ABSTRACT

The present invention relates to a method of forming a level silicon oxide layer on a semiconductor wafer. The semiconductor wafer comprises a substrate having a first region containing no silicon nitride on its surface and a second region which is higher than the first region and contains a silicon nitride layer on its surface. The method comprises performing a cleaning process on the semiconductor wafer with an alkaline solution to uniform the deposition rate over the surface of the first region; and performing a deposition process employing ozone as a reactive gas with a flow capacity of 80–200 g/L to form a silicon oxide layer above the first and second regions wherein the deposition rate of the silicon oxide layer on the first region is higher than that on the second region and the silicon oxide layer above the first region is leveled with that above the second region after a predetermined period of time.

7 Claims, 2 Drawing Sheets

METHOD OF FORMING A LEVEL SILICON OXIDE LAYER ON TWO REGIONS OF DIFFERENT HEIGHTS ON A SEMICONDUCTOR WAFER

BACKGROUND OF THE INVENTION

1. Field of the Invention

The present invention relates to a method of forming a level silicon oxide layer on a semiconductor wafer, and more particularly, to a method of forming a level silicon oxide layer on two regions of different heights on a semiconductor wafer.

2. Description of the Prior Art

In the semiconductor process, the silicon oxide ($SiO_x$) manufacturing technique is very mature and the costs are very low. Hence, the silicon oxide layer is the most common material used as the dielectric layer for electrical isolation on a semiconductor wafer. The method of forming a dielectric layer made of silicon oxide utilizes the film deposition process which includes injecting silane ($SiH_4$), tetra-ethyl-ortho-silicate (TEOS) and oxygen ($O_2$). A dielectric film is created on the semiconductor wafer from the chemical reaction of the gas mixture.

Please refer to FIG. 1. FIG. 1 is a schematic diagram of depositing a silicon oxide layer 14 on a semiconductor wafer 10. The prior art method of forming a level silicon oxide layer utilizes atmospheric pressure chemical vapor deposition (APCVD), which comprises putting the semiconductor wafer 10 on an APCVD machine (not shown) to perform the APCVD process, and then forming $O_3$-TEOS by injecting reactive gasses comprising $O_3$ and TEOS to form the silicon oxide layer 14 on the semiconductor wafer 10. The silicon oxide layer 14 thus formed by this method has a good gap filling ability so it has often been used as the inter-metal layer (IMD) or inter-layer dielectric (ILD).

Note that the surface of the semiconductor wafer 10 has many devices with different heights and made of different materials. For example, the substrate 12 made of silicon and the shallow trench 13 made of silicon dioxide form the lower surface. The anti-reflection layer (not shown) made of SiON and the mask 15 made of $Si_xN_y$ form the higher surface. In FIG. 1, the region 16 means the lower region on the semiconductor wafer 10 is designated as the first region and labelled as region 16, and the higher region on the semiconductor wafer 10 is designated as the second region and labelled as region 18. The subsequent silicon oxide layer 14 will follow the lower and higher topography when it is deposited on to the semiconductor wafer 10. Besides, the deposition rate of the $O_3$-TEOS on the semiconductor wafer 10 changes with the material of the surface where the $O_3$-TEOS is deposited onto. Ozone ($O_3$) has an especially strong sensitivity to different surface materials. The order of the deposition rates for different material is as follows: silicon>silicon oxide formed by using thermal oxidation>silicon oxide formed by using deposition>$Si_xN_y$. When ozone is used to create a deposition layer, a silicon oxide layer 14 is formed with non-uniform height on the semiconductor wafer 10.

Please refer to FIG. 2. FIG. 2 is a schematic diagram of the silicon oxide layer 14 shown in FIG. 1 after polishing. For the stability of the subsequent semiconductor processes, after the deposition of the silicon oxide layer 14 as the IMD or ILD, a planarization process must be performed to level the surface of the semiconductor wafer 10. During the planarization process, a spin-on glass (SOG) process is performed to form a SOG (not shown) on the silicon oxide layer 14 which has a non-uniform height on the semiconductor wafer 10. Then, an etching back process or a chemical mechanical polishing (CMP) is performed to level the surface of the silicon oxide layer 14. Planarization of silicon oxide layer 14 can also be performed directly with CMP. The prior art method of forming the level silicon oxide layer 14 on the semiconductor wafer 10 requiring performing the planarization process after the deposition process increases the complexity of the whole process and raises production costs.

SUMMARY OF THE INVENTION

It is therefore a primary objective of the present invention to provide a method of forming a level silicon oxide layer on a semiconductor wafer to solve the above mentioned problem.

In a preferred embodiment, the present invention relates to a method of forming a level silicon oxide layer on a semiconductor wafer, the semiconductor wafer comprising a substrate having a first region containing no silicon nitride on its surface and a second region that is higher than the first region and which contains a silicon nitride layer on its surface. The deposition rate of forming a silicon oxide layer on the first region will be higher than that of the second region, the method comprising:

performing a cleaning process on the semiconductor wafer with an alkaline solution to uniform the deposition rate over the surface of the first region; and performing a deposition process employing ozone as a reactive gas with a flow capacity of 80–200 g/L to form a silicon oxide layer above the first and second regions wherein the deposition rate of the silicon oxide layer on the first region is higher than that on the second region and the silicon oxide layer above the first region is leveled with that above the second region after a predetermined period of time.

It is an advantage of the present invention that the silicon oxide layer does not need any subsequent planarization process, and hence the production costs are reduced.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 1:
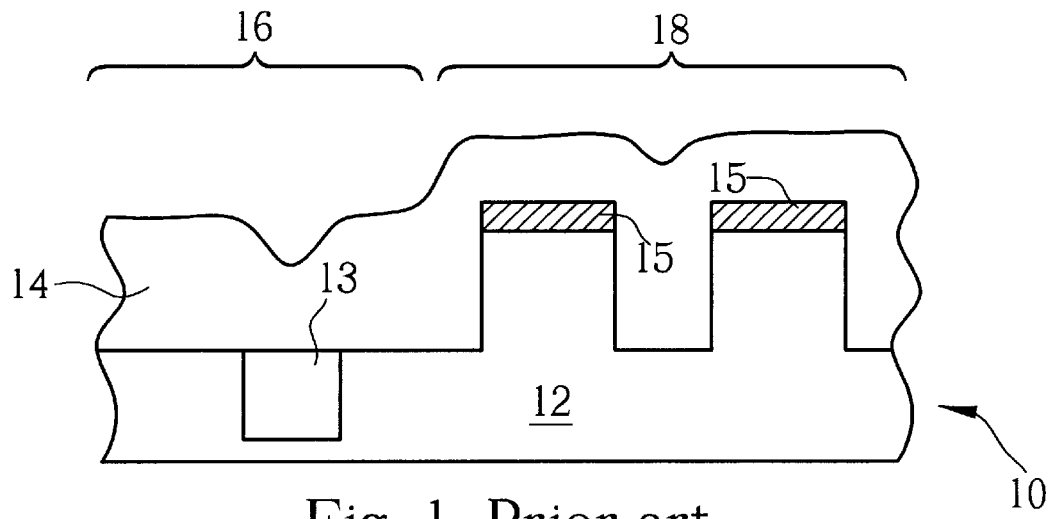
FIG. 1 is a schematic diagram of depositing a silicon oxide layer on a semiconductor wafer.
Figure 2:
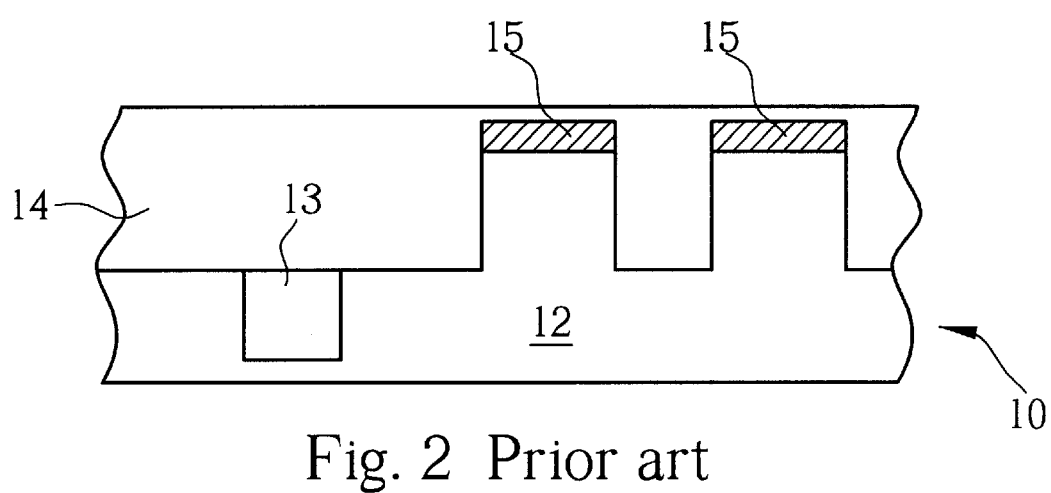
FIG. 2 is a schematic diagram of the silicon oxide layer shown in FIG. 1 after polishing.
Figure 3:
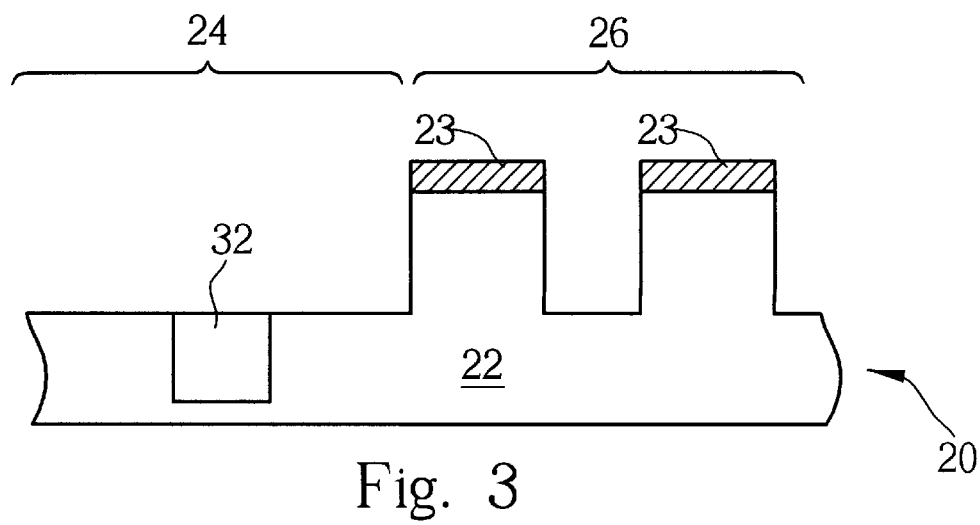
FIG. 3 and FIG. 4 are the schematic diagrams of the process of depositing a level silicon oxide layer on a semiconductor wafer according to the present invention.
Figure 4:
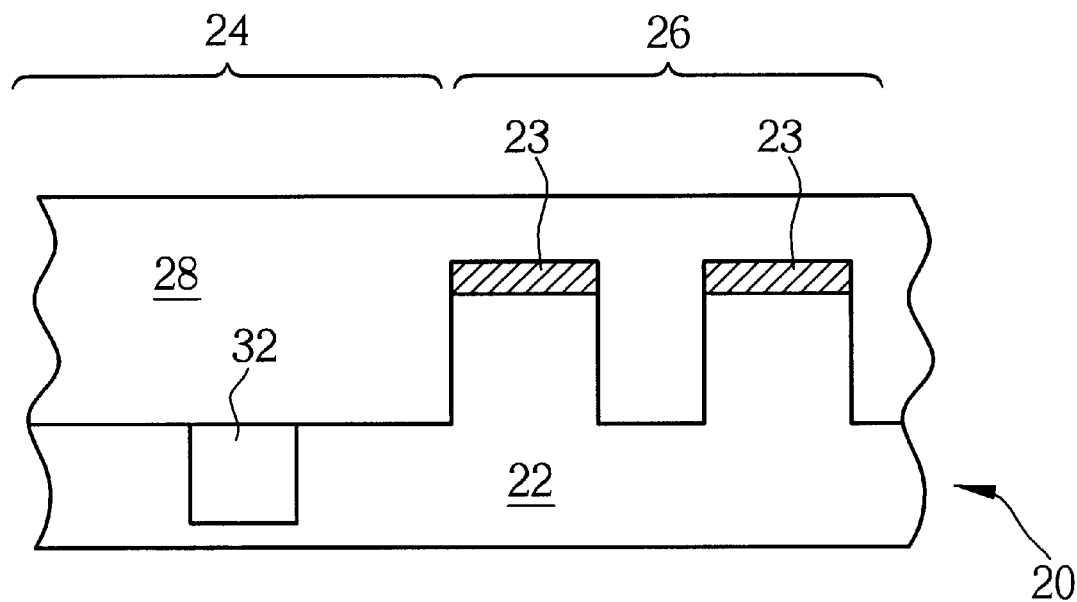

Please refer to FIG. 3 and FIG. 4. FIG. 3 and FIG. 4 are the schematic diagrams of the process of depositing a level silicon oxide layer 28 on a semiconductor wafer 20 according to the present invention. The present invention provides a method of forming a level silicon oxide layer on a semiconductor wafer 20. The semiconductor wafer 20 comprises a Si substrate 22. The Si substrate 22 has various devices on it and has a first region 24 and a second region 26 which is higher than the first region. The first region 24 contains Si, $SiO_2$ or $SiO_xN_y$ on its surface such as Si for the substrate 22, and $SiO_2$ for filling a shallow trench 32, but contains no $Si_xN_y$. The surface of the second region 26 contains a silicon nitride layer 23.

The method of the present invention performs a cleaning process with an alkaline solution on the semiconductor wafer 20 as shown in FIG. 3. Then, any remaining alkaline solution on the semiconductor wafer 20 is completely removed by using the spin dry method. This prevents any watermark formed on the surface of the semiconductor wafer 20. Next, an APCVD deposition process employing ozone with a predetermined high concentration and a flow capacity of 80–200 g/L and TEOS as reactive gases is performed to uniformly form a silicon oxide layer 28 on semiconductor wafer 20, as shown in FIG. 4.

The alkaline solution employed in the cleaning process of the present invention is KOH, NaOH or $NH_4OH$. Moreover, the alkaline solution further comprises $H_2O_2$ as an oxidizing agent for the cleaning process. During the cleaning process, the surface of the semiconductor wafer 20 will come into uniform contact with the alkaline solution. The first region 24 will undergo chemical reactions with the alkaline solution, but the second region 26 covered by the silicon nitride layer 23 does not. As a result, there will be an uniform deposition rate as depositing the silicon oxide layer onto the surface of the first region 24 containing several materials. After the cleaning process, the APCVD deposition with ozone and TEOS can be performed to directly form an approximately level silicon oxide layer.

The silicon nitride layer 23 of the second region 26 does not undergo any chemical reaction with the alkaline solution. Besides, as noted in the prior description, the deposition rate of ozone varies with the surface materials, and the silicon nitride layer 23 has the smallest deposition rate. Therefore, during the formation of the silicon oxide layer 28 on the semiconductor wafer 20, the deposition rate of the silicon oxide layer 28 on the first region 24 containing no silicon nitride layer 23 is higher than that on the second region 26 containing the silicon nitride layer 23. Utilizing these differing deposition rates in combination with the height diversity to control the deposition time for forming the silicon oxide layer 28, an approximately level silicon oxide layer 28 can be formed on the semiconductor wafer 20. The thickness of the silicon oxide layer 28 on the higher second region 26 is much less than that on the lower first region 24.

In the present invention, the semiconductor wafer 20 is first cleaned using the alkaline solution to uniform the deposition rate over the surface of the first region 24. Then, utilizing the different deposition rates between the first region 24 and the second region 26 and the height diversity between these two regions, the deposition process is performed wherein the deposition rate of the silicon oxide layer on the first region 24 is higher than that on the second region 26. So, the method of the present invention can form a silicon oxide layer 28 wherein the silicon oxide layer above the first region 24 is leveled with that above the second region 26 on the semiconductor wafer 20.

Figure 5:
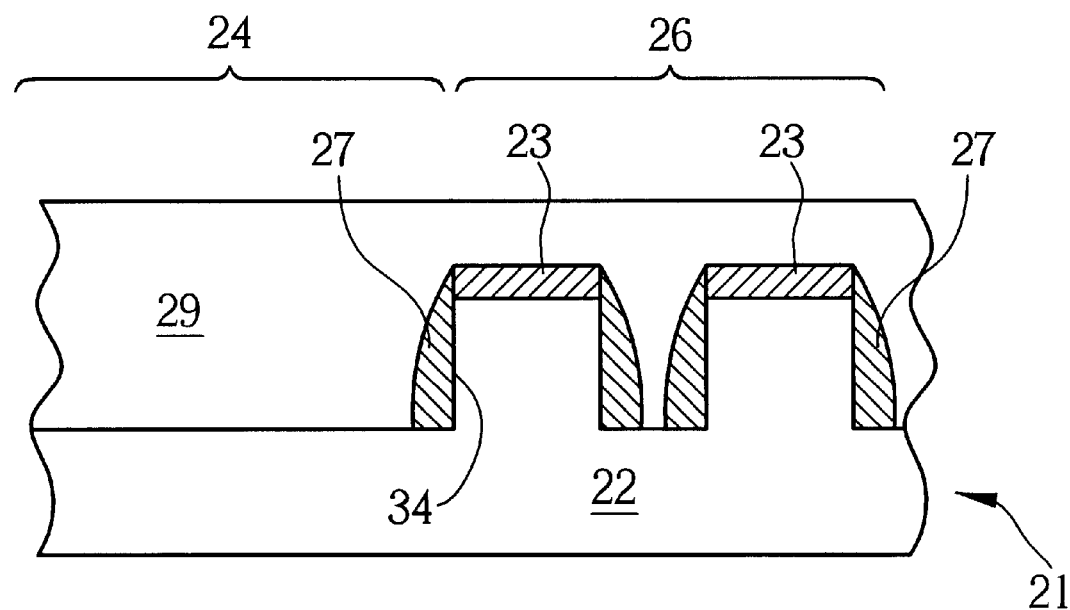
FIG. 5 is a schematic diagram of an alternative method of forming a level silicon oxide layer on the semiconductor wafer according to the present invention.

Please refer to FIG. 5. FIG. 5 is a schematic diagram of an alternative method for forming a level silicon oxide layer 29 on a semiconductor wafer 21 according to the present invention. The semiconductor wafer 21 comprises two vertical side-walls 34 on each second region 26. The surface of side-wall 34 comprises a spacer 27 made of silicon nitride to be used as a protective isolation layer. With this structure, there is a vertical side-wall 34 between the first and second regions 24,26, and the side-wall 34 comprises a spacer 27. The method of the present invention can also work on this structure to form a level silicon oxide layer 28. Under a scanning electron microscope, it is found that the silicon oxide layer 28 on the semiconductor wafer 21 formed by the present invention is level.

To compare with the prior art method, the prior art method must perform an SOG process and a CMP to obtain the planarization of the silicon oxide layer 28. The method of the present invention uses an alkaline solution to clean the semiconductor wafer, which uniforms the deposition rate over the surface of first region 24, then utilizes the different deposition rates of two regions to compensate for the height diversity, wherein the deposition rate of the silicon oxide layer on the first region 24 is higher than that on the second region 26. So the present method can form a level silicon oxide layer on the semiconductor wafer without any other planarization processes, and hence keep production costs down.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of forming a level silicon oxide layer on a semiconductor wafer, the semiconductor wafer comprising a substrate having a first region containing no silicon nitride on its surface and a second region which is higher than the first region and contains a silicon nitride layer on its surface, the deposition rate of forming a silicon oxide layer on the first region being higher than that of the second region, the method comprising:

performing a cleaning process on the semiconductor wafer with an alkaline solution to uniform the deposition rate over the surface of the first region; and performing a deposition process employing ozone as a reactive gas with a flow capacity of 80–200 g/L to form a silicon oxide layer above the first and second regions wherein the deposition rate of the silicon oxide layer on the first region is higher than that on the second region and the silicon oxide layer above the first region is leveled with that above the second region after a predetermined period of time.

2. The method of claim 1 wherein the deposition process is an atmospheric pressure chemical vapor deposition (APCVD) process.

3. The method of claim 1 wherein the deposition process employs ozone and Tetra-Ethyl-Ortho-Silicate (TEOS) as the reactive gases.

4. The method of claim 1 wherein the alkaline solution is KOH NaOH or $NH_4OH$.

5. The method of claim 4 wherein the alkaline solution further comprises $H_2O_2$.

6. The method of claim 1 wherein the first region contains silicon (Si) silicon dioxide ($SiO_2$) or $SiO_xN_y$ on its surface.

7. The method of claim 1 wherein an approximately vertical side wall is positioned between the first region and the second region, and the surface of the side wall comprises a spacer formed by silicon nitride.

* * * * *